United States Patent
Park et al.

(10) Patent No.: US 7,439,176 B2
(45) Date of Patent: Oct. 21, 2008

(54) SEMICONDUCTOR DEVICE MULTILAYER STRUCTURE, FABRICATION METHOD FOR THE SAME, SEMICONDUCTOR DEVICE HAVING THE SAME, AND SEMICONDUCTOR DEVICE FABRICATION METHOD

(75) Inventors: Jae-Hwa Park, Gyeonggi-do (KR); Jang-Hee Lee, Gyeonggi-do (KR); Dae-Yong Kim, Gyeonggi-do (KR); Hee-Sook Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 11/379,350

(22) Filed: Apr. 19, 2006

(65) Prior Publication Data

US 2006/0223252 A1  Oct. 5, 2006

Related U.S. Application Data

(63) Continuation-in-part of application No. 11/214,680, filed on Aug. 29, 2005.

(30) Foreign Application Priority Data

| Apr. 4, 2005 | (KR) | ............................. 2005-28245 |
| Dec. 29, 2005 | (KR) | ......................... 2005-0134428 |

(51) Int. Cl.
*H01L 21/44* (2006.01)
*H01L 23/52* (2006.01)

(52) U.S. Cl. .................................... 438/653; 257/751

(58) Field of Classification Search ............... 438/585, 438/592, 643–653; 257/751, 770, E23.016
See application file for complete search history.

(56) References Cited

U.S. PATENT DOCUMENTS

| 5,695,942 | A | | 12/1997 | Itoh et al. |
| 5,923,999 | A | * | 7/1999 | Balasubramanyam et al. ........................ 438/592 |
| 6,068,383 | A | | 5/2000 | Robertson et al. |
| 6,096,630 | A | | 8/2000 | Byun et al. |
| 6,198,144 | B1 | | 3/2001 | Pan et al. |

(Continued)

FOREIGN PATENT DOCUMENTS

JP  6-140355  5/1994

(Continued)

OTHER PUBLICATIONS

English language abstract of Korean Publication No. 2000-0004224.

(Continued)

*Primary Examiner*—Calvin Lee
(74) *Attorney, Agent, or Firm*—Marger Johnson & McCollom, P.C.

(57) ABSTRACT

In one embodiment, a semiconductor device comprises a semiconductor substrate and a doped conductive layer formed over the semiconductor substrate. A diffusion barrier layer is formed over the doped conductive layer. The diffusion barrier layer comprises an amorphous semiconductor material. After forming the diffusion barrier layer, a heat treatment process may be additionally performed thereon. An ohmic contact layer is formed over the diffusion barrier layer. A metal barrier layer is formed over the ohmic contact layer. A metal layer is formed over the metal barrier layer.

13 Claims, 8 Drawing Sheets

U.S. PATENT DOCUMENTS

| | | |
|---|---|---|
| 6,218,252 B1 | 4/2001 | Yeo |
| 6,277,719 B1 | 8/2001 | Chern et al. |
| 6,306,743 B1 | 10/2001 | Lee |
| 6,313,539 B1 | 11/2001 | Yokoyama et al. |
| 6,608,383 B2 | 8/2003 | Yokoyama et al. |
| 6,774,442 B2 | 8/2004 | Hayashi et al. |
| 2002/0072209 A1* | 6/2002 | Tseng ................ 438/592 |
| 2005/0095794 A1 | 5/2005 | Park |
| 2006/0014355 A1* | 1/2006 | Park et al. ............ 438/382 |

FOREIGN PATENT DOCUMENTS

| | | |
|---|---|---|
| JP | 2001-326348 | 11/2001 |
| JP | 2003-163348 | 6/2003 |
| KR | 1999-0080889 | 11/1999 |
| KR | 2000-0004224 | 1/2000 |
| KR | 2000-0041468 | 7/2000 |
| KR | 10-0456316 | 10/2004 |

OTHER PUBLICATIONS

English language abstract of Korean Publication No. 2000-0041468.
English language abstract of Korean Publication No. 10-0456316.
English language abstract of Japanese Publication No. 2001-326348.

* cited by examiner

SEMICONDUCTOR DEVICE MULTILAYER STRUCTURE, FABRICATION METHOD FOR THE SAME, SEMICONDUCTOR DEVICE HAVING THE SAME, AND SEMICONDUCTOR DEVICE FABRICATION METHOD

This application is a continuation-in part (CIP) of U.S. patent application Ser. No. 11/214,680, filed on Aug. 29, 2005, which claims priority from Korean Patent Application No. 2005-28245 filed on Apr. 4, 2005 and also claims priority from Korean Patent Application No 2005-0134428 filed on Dec. 29, 2005, the disclosures of which are incorporated herein by reference in their entirety.

BACKGROUND OF INVENTION

1. Field of the Invention

The present invention generally relates to semiconductor fabrication and, more particularly, to the fabrication of a low-resistance multilayer structure and formation of ohmic contacts.

2. Description of Related Art

As semiconductor devices continue to scale down, the conventional polysilicon gate electrode is becoming inadequate. One problem is relatively high resistivity and another is depletion of dopants in the polysilicon gate electrode in proximity to the interface between the polysilicon gate electrode and the gate dielectric. In particular, as integration degree and speed of devices are increased, a signal delay arises from the resistances of the gate electrode and the interconnection. A "so-called" polycide gate including a metal silicide film and a polysilicon film has been proposed to reduce the resistance and in turn reduce the signal delay in the semiconductor devices such as a MOS transistor.

To overcome these deficiencies of polysilicon or polycide gate, poly-metal gates having a stack structure of a refractory metal film, a barrier metal film and a polysilicon film or metal gates are being pursued as an alternative. This is particularly true, if the gate electrode has a length of less than about 0.25 µm, requiring the use of a gate electrode having a resistance lower than that of the polycide gate.

More recently, among the poly-metal gates, a doped poly/tungsten (W) gate structure has received special attention as it has lower word line resistance and lower stack height. This is because tungsten has a low sheet resistance. For example, if a tungsten film is used as a refractory metal film, an RC signal delay time can be remarkably reduced because the resistivity of the tungsten is smaller than that of the tungsten silicide ($WSi_x$). Also, a dual poly/tungsten gate has become more popular as it has high current drivability and a lower threshold voltage.

However, the poly-metal gate structure is not without its limitations. For example, tungsten may react with polysilicon at high temperatures to form undesirable compounds, thereby increasing interface resistance therebetween and slowing down the operation speed of the semiconductor device. Some tungsten atoms may even diffuse into a gate dielectric layer, degrading the device characteristics. Thus, a barrier metal layer is formed between the tungsten and polysilicon to reduce or prevent any reaction between them.

Unfortunately, the interface resistance of such a barrier metal layer is known to be very high. Therefore, in the prior art, to reduce the interface resistance, an ohmic contact layer is formed between the metal barrier layer and the polysilicon layer. However, the ohmic contact layer, which is typically formed of a metal silicide, acts as a diffusion path of dopants, aggravating a so-called "poly depletion" problem. In particular, dopants such as boron (B) undesirably out-diffuse from a polysilicon gate during heat treatment processes such as rapid thermal processing (RTP), leading to a consequential low inversion capacitance of the transistor. Various approaches have been attempted to solve these problems.

Embodiments of the invention address these and other disadvantages of the conventional art.

SUMMARY

In one embodiment, a semiconductor device comprises a semiconductor substrate and a doped conductive layer formed over the semiconductor substrate. A diffusion barrier layer is formed over the doped conductive layer. The diffusion barrier layer comprises an amorphous semiconductor material. After forming the diffusion barrier layer, a heat treatment process may be additionally performed thereon. An ohmic contact layer is formed over the diffusion barrier layer. A metal barrier layer is formed over the ohmic contact layer. A metal layer is formed over the metal barrier layer. With the diffusion barrier layer of the present invention, the prior art problems such as poly depletion can be effectively suppressed, resulting in a high inversion capacitance in a semiconductor device such as a PMOS transistor of a CMOS device.

BRIEF DESCRIPTION OF THE DRAWINGS

The aspects and advantages of the present invention will become more apparent with the detailed description of the exemplary embodiments with reference to the attached drawings.

DETAILED DESCRIPTION OF THE DRAWINGS

In the following description, several exemplary embodiments of the invention are described. These exemplary embodiments are not intended to be limiting in any way, but rather to convey the inventive aspects contained in the exemplary embodiments to those skilled in this art. Those skilled in this art will recognize that various modifications may be made to the exemplary embodiments without departing from the scope of the invention as defined in the attached claims.

Figure 1:
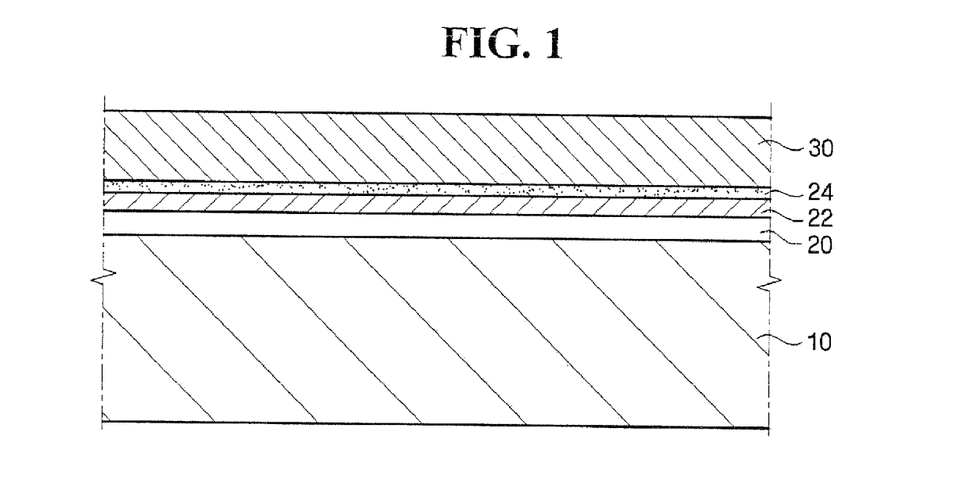
FIG. 1 is a cross-sectional view showing a multilayer structure of a semiconductor device according to one embodiment.

FIG. 1 is a cross-sectional view showing a multilayer structure of a semiconductor device according to one embodiment of the present invention. In particular, a lower conductive layer 10 is formed over a semiconductor substrate (not shown). The lower conductive layer 10 may be a polycrystalline silicon ("polysilicon") doped with known p-type or n-type impurities.

A diffusion barrier layer 20 is formed on the lower conductive layer 10. Then, an ohmic contact layer 22 is formed over the diffusion barrier layer 20. Next, a metal barrier layer 24 is formed over the ohmic contact layer 22. The metal barrier layer 24 may be a metal nitride such as WN or TiN. Subsequently, a metal layer 30 formed of a metal having a low sheet resistance such as tungsten is formed over the metal barrier layer 24.

As discussed above, the metal barrier layer 24 is formed between the metal layer 30 and the polysilicon layer 10 to prevent or reduce any reaction therebetween, e.g., the reactive formation of a silicide material such as tungsten silicide, by suppressing the mutual inter-diffusion of metal and silicon. Such a silicide material typically has a resistance value that is higher than that of metal, thereby undesirably increasing the resistance in the gate electrode.

On the other hand, the ohmic contact layer 22 decreases the contact, or interface, resistance between the lower conductive layer 10 and the metal barrier layer 24. Because the contact resistance between the lower conductive layer 10 and the metal barrier layer 24 such as WN or TiN is high, the ohmic contact layer 22 is formed between the lower conductive layer 10 and metal barrier layer 24, thereby substantially reducing the interface resistance therebetween. The ohmic contact layer 22 may be a refractory metal silicide such as WSix, TiSix, CoSix and so on. Preferably, the refractory metal silicide comprises W and Si.

As for the diffusion barrier layer 20, it prevents the diffusion of the dopants therethrough.

In detail, if the ohmic contact layer 22 is formed of a metal silicide, it may act as a diffusion path for dopants such as boron (B), phosphorous (P), or arsenic (As). In particular, the dopants from the lower conductive layer 10 can diffuse or be absorbed into the metal silicide, for example, through the grain boundaries of the metal silicide. This would reduce the dopant concentration in the lower conductive layer 10 and change the threshold voltage of the transistor, e.g., a CMOS transistor ("poly depletion"), thereby lowering the inversion capacitance of the device as discussed in the background.

However, because of the diffusion barrier layer 20 interposed between the ohmic contact layer 22, which is typically formed of refractory metal silicide, and the lower conductive layer 10, the diffusion paths for the dopants through the metal silicide from the lower conductive layer 10, e.g., polysilicon, can be substantially reduced.

Applicants believe that, among other possible reasons, this is because the diffusion barrier 20 is formed of an amorphous semiconductor material such as amorphous silicon, which has substantially no grain boundaries. That is, since there are substantially no grain boundaries (or only a small amount of grain boundaries) within the diffusion barrier layer 20, the out-diffusion of the dopants from the lower conductive layer 10 or interconnection line that otherwise would have passed through the ohmic contact layer 22, can be significantly reduced. The solid solubility of the dopants to the diffusion barrier layer 20 may be lower than that to the ohmic contact layer 22 to reduce the diffusion of the dopants through the ohmic contact layer 22. Depending on application, the diffusion barrier layer 20 may be seen as a composite of the amorphous silicon and polysilicon subsequent to the heat treatment. As a result, the diffusion barrier layer 20 increases the inversion capacitance value of PMOS transistor and the poly depletion problem can be addressed, as will be explained further below with respect to FIG. 2.

Figure 2:
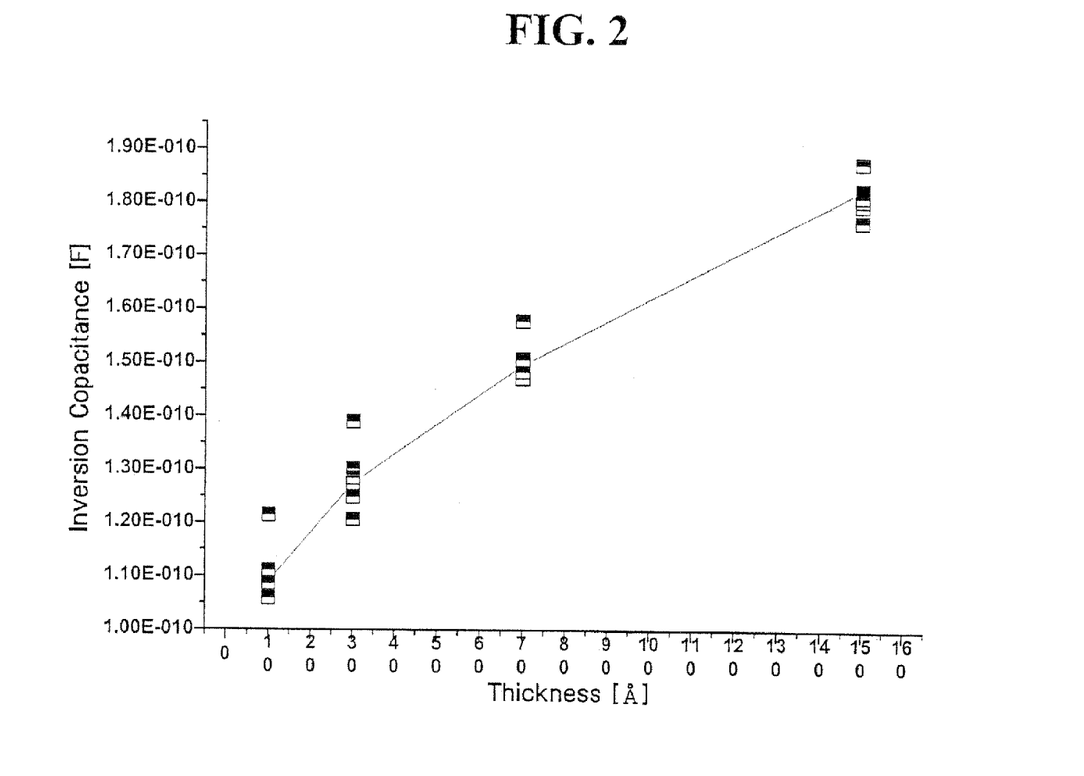
FIG. 2 is a graph illustrating an increase in the inversion capacitance value as a function of the thickness of a diffusion barrier layer.

FIG. 2 illustrates an effect of the present invention, e.g., an increase in the inversion capacitance value (vertical axis, in Farads (F)) as a function of the thickness of the diffusion barrier layer 20 (horizontal axis, in Angstroms (Å)), e.g., an (initially undoped but may be doped during the subsequent processing steps involving heat treatment) amorphous silicon layer in a PMOS transistor in accordance with one embodiment of the present invention. As shown, with the diffusion barrier layer 20 interposed between the ohmic contact layer 22 and the lower conductive layer 10, the overall inversion capacitance value increases. Further, an inversion capacitance (F) increases proportionately to the thickness of diffusion barrier layer 20. According to the experimental results, the thickness of the diffusion barrier layer 20 is preferably greater than or equal to about 30 angstroms, more preferably, about 30 angstroms to about 150 angstroms. This is because the device typically requires the inversion value of at least greater than about 120 pF ("1.20-010") to operate properly. Thus, with embodiments of the present invention, because it is possible to reduce the out-diffusion of dopants from the lower conductive layer 10 with the diffusion barrier layer 20, the overall inversion capacitance value beneficially increases.

Figure 3:
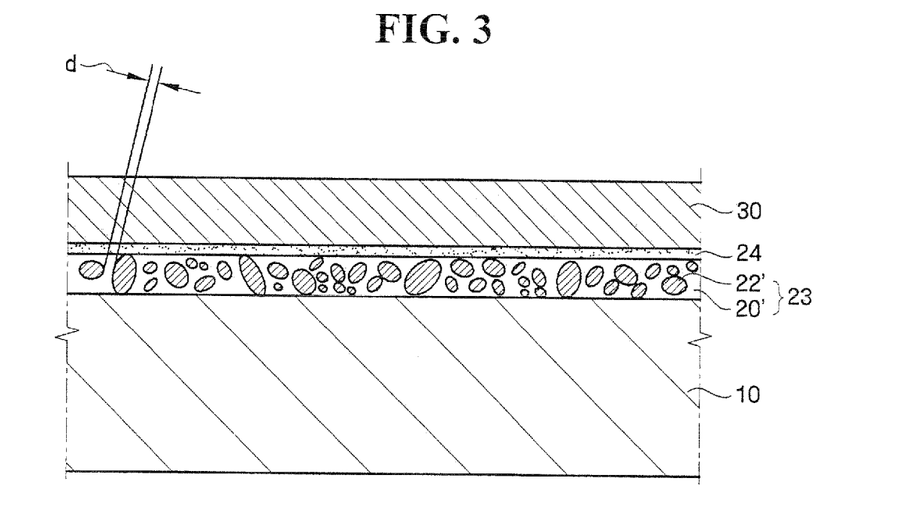
FIG. 3 is a cross-sectional view showing a multilayer structure of a semiconductor device according to another embodiment.

FIG. 3 is a cross-sectional view showing a multilayer structure of semiconductor device according to another embodiment. In this embodiment, a doped conductive layer 10, a metal barrier layer 24, a metal layer 30 are formed in the same or similar manner as in the embodiment disclosed with reference to FIG. 1 with the exception that a single-layer composite diffusion barrier layer 23 is formed in place of the diffusion barrier layer 20 and the ohmic contact layer 22 of FIG. 1.

Accordingly, in this embodiment, a lower doped conductive layer 10 is formed over the semiconductor substrate (not shown). A diffusion barrier layer 23 is formed over the doped conductive layer 10. The diffusion barrier layer 23 has a plurality conductive particles 22' dispersed in a diffusion barrier layer 20'. The diffusion barrier layer 20' is initially formed in the same or similar manner to the diffusion barrier layer 20 of FIG. 1. Preferably, the plurality of conductive particles 22' have substantially non-uniform sizes. The plurality of conductive particles 22' can function as an ohmic contact layer 22 of FIG. 1. The conductive particles 22' may be seen as a discontinuous ohmic contact layer. Then, a metal barrier layer 24 is formed on the diffusion barrier layer 23. A metal layer is formed on the metal barrier layer 24.

According to an aspect of the present invention, the multi-layer structure shown in FIG. 3 can be formed by forming the multi-layer structure including the diffusion barrier layer 20 and the ohmic contact layer 22 shown in FIG. 1 and heating the resulting structure at least until the conductive particles 22' forms in the diffusion barrier layer 20'. The heating may be performed at a temperature range of about 600 to about 800° C.

The greater the thickness of the diffusion barrier layer 20', the greater the decrease in the diffusion paths. This is due to an increase in the distance "d" between the conductive particles 22' dispersed in the diffusion barrier layer 20', as illustrated in FIG. 3. In this respect, the greater the thickness of the diffusion barrier layer 20', the larger the conductive (possibly agglomerated) particles 22'. The sizes of the conductive particles 22' may vary. Although applicants do not wish to be held to a particular theory of operation, this phenomenon can be explained as follows. Metal silicide such as tungsten silicide and amorphous silicon are unstable and tend to change their structures at high temperatures, e.g., crystallization of silicon or agglomeration of metal silicide. The tungsten silicide particles may reach the boundary between the diffusion barrier layer 20' and the doped conductive layer 10 typically formed of doped polysilicon. Also, it has been observed that the thicker the diffusion barrier layer 20', the greater the average distance or spacing between the conductive particles 22' because they have more spaces to migrate, e.g. disperse or spread, within the diffusion barrier layer 20'. Thus, as shown in FIG. 3, the spacing between the particles 22' indicated as "d" is increased as the thickness of the diffusion barrier layer 20' increased. In turn, as the spaces between the particles 22' to be filled by the portions of the diffusion barrier layer 20', the measure of which is indicated by the spacing "d," are increased, the diffusion paths can also be substantially reduced.

Depending on application, the diffusion barrier layer 20' may be seen as a composite of the amorphous silicon and polysilicon.

Further, in the case of non-volatile memories such as a flash memory or static random access memory (SRAM), the multilayer structure shown in FIG. 1 can be maintained after the formation thereof, since it would not be subjected to a high temperature (these devices have a relatively lower thermal budget). However, in the case of high thermal budget devices such as DRAM, it would be subjected to a relatively high temperature of greater than or equal to about 600° C. in the subsequent processing steps such as rapid thermal processing (RTP) activation or a relatively high temperature of about 730 to 760° C. in the silicon nitride deposition steps.

Thus, the composite diffusion barrier layer 23 is formed by the interaction between the ohmic contact layer 22 and the diffusion barrier layer 20 of FIG. 1. That is, the composite diffusion barrier layer 23 is formed sandwiched between the doped conductive layer 10 and the metal diffusion barrier layer 24. The thickness of the composite diffusion barrier layer 23 of FIG. 3 may be approximately equal to a sum of thicknesses of the diffusion barrier layer 20 and the ohmic contact layer 22 of FIG. 1, before the resulting structure is heat treated. Preferably, the thickness of the diffusion barrier layer 23 is no less than about 250 angstroms. Preferably, the refractory metal silicide comprises W and Si. The composite diffusion barrier layer 23 may include amorphous silicon and partially crystallized silicon, i.e., polysilicon.

Figure 4:
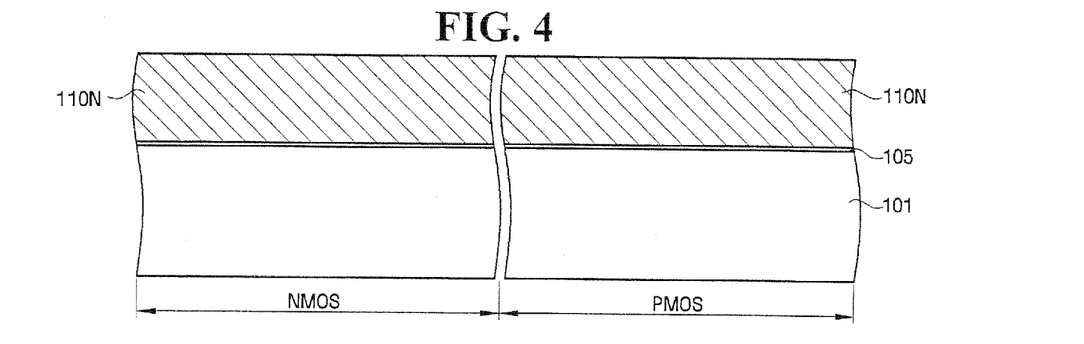
FIGS. 4 through 9 are cross-sectional views of a multilayer structure including a diffusion barrier and the consecutive steps involved in a method for manufacturing the same according to some embodiments of the present invention.

FIGS. 4 through 9 are cross-sectional views of a multilayer structure including a diffusion barrier and a method for manufacturing the same according to one embodiment of the present invention. The elements having the same functions as those shown in FIG. 1 are denoted by the similar reference numerals, and a detailed description thereof is omitted. Referring to FIG. 4, a gate insulating layer 105 is formed over a semiconductor substrate 101 having an NMOS region for a cell region and a PMOS region for a peri/core region. An n-type doped polysilicon layer 110N having a thickness of, for example, about 800 to about 1000 angstroms is formed over the gate insulating layer 105.

Figure 5:
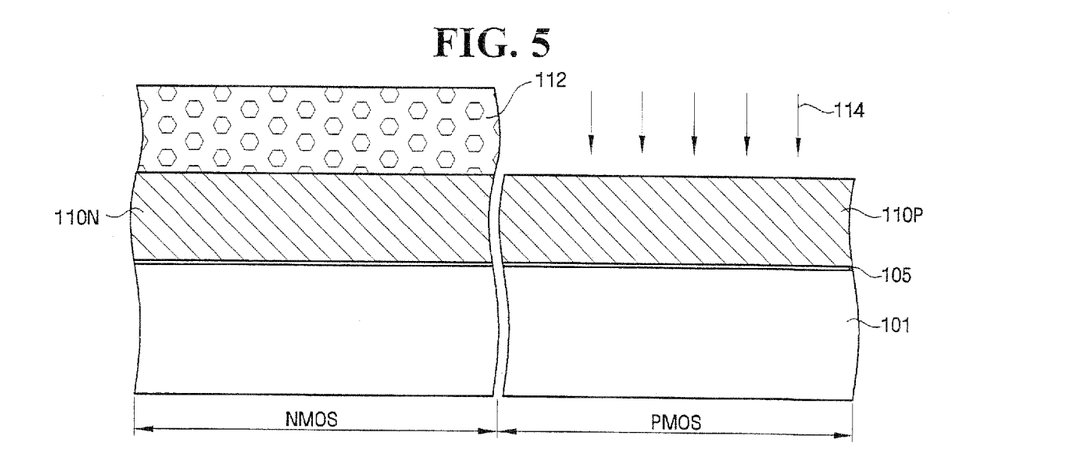

Referring to FIG. 5, a patterned photoresist 112 is then formed over the n-type doped polysilicon layer 110N. Then, a p-type doped polysilicon layer 110P is formed over the PMOS region using conventional techniques such as an ion implantation process indicated by arrows 114 using the patterned photoresist 112 as a mask. Alternatively, a plasma doping process can be used.

Figure 6:
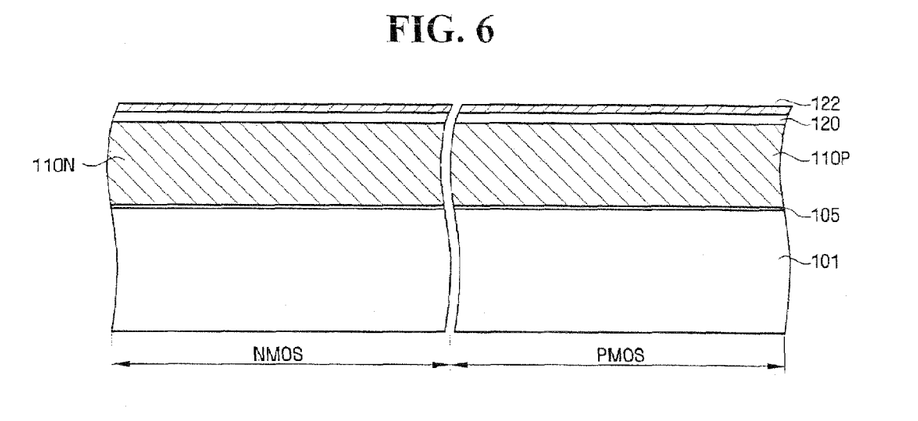

Referring to FIG. 6, a diffusion barrier layer 120, which comprises an amorphous semiconductor material, is subsequently formed over the n-type and p-type doped polysilicon layers 110N, 110P. The diffusion barrier layer 120 is initially undoped but may be incidentally doped by dopants out-diffused from adjacent doped conductive layers following the subsequent heat treatment. The diffusion barrier layer 120 is formed to a thickness of preferably greater than or equal to about 30 angstroms. An ohmic contact layer 122 having a thickness of from about 50 angstroms to 100 angstroms (more preferably, about 70 to about 80 angstroms) is formed over the diffusion barrier layer 120. Next, a metal barrier layer 124 having a thickness of about 50 to 100 angstroms is formed over the ohmic contact layer 122. Subsequently, a metal layer 130 formed of a metal such as refractory metal is formed over the metal barrier layer 124. The metal layer 130 is formed to a thickness of from about 300 angstroms to about 600 angstroms.

According to one aspect of the present invention, if the diffusion barrier layer 120 is formed of an amorphous silicon, a tungsten silicide layer can be uniformly formed on polysilicon layers of different conductive types, thereby overcoming selective deposition issues of tungsten silicide. In contrast, in the prior art, when the tungsten silicide layer is formed directly on the polysilicon layer as an ohmic contact layer, there has be an undesirable difference in the rate of deposition of the tungsten silicide on the polysilicon layers in CMOS devices, depending on the conductivity types of the polysilicon layers. However, by forming the diffusion barrier 120, particularly formed of an amorphous silicon material, on the doped polysilicon layers 110N, 110P, the ohmic contact layer 122 formed of a material such as tungsten silicide can be uniformly formed on the diffusion barrier layer 120, thereby preventing selective deposition of tungsten silicide over the polysilicon layers 110N, 110P. Also, before the amorphous silicon layer is formed, in accordance with some embodiments of the invention, a silane pre-flow process can be performed at adequate temperatures of about 600 to 650° C.

Figure 7:
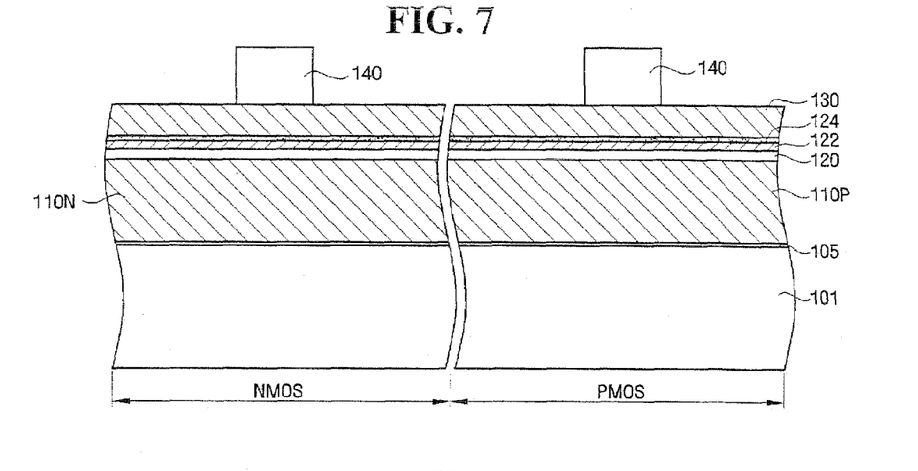

Referring to FIG. 7, a hard mask pattern 140 is then formed over the refractory metal layer 130.

Figure 8:
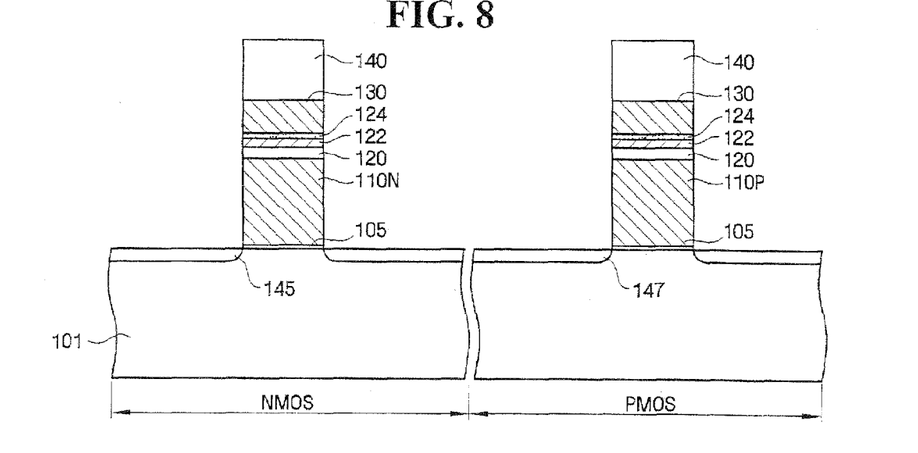
Figure 9:
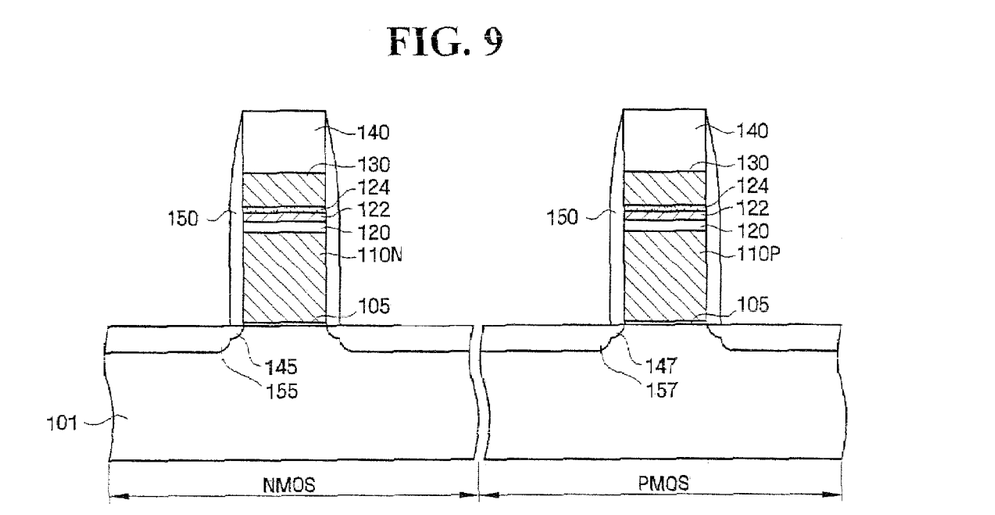

Referring to FIG. 8, the metal layer 130, the metal barrier layer 124, the ohmic contact layer 122, the diffusion barrier layer 120, the doped conductive layers 110 N, 110P and the gate insulating layer 105 are patterned, using the hard mask pattern 140, to form a gate structure in each of the NMOS region and the PMOS region, respectively. Next, an ion implantation process is performed to form first concentration impurity regions or LDD regions 145 and 147 in NMOS and PMOS regions, respectively. Referring now to FIG. 9, sidewall spacers 150 are formed on sidewalls of the gate structures formed on the NMOS and PMOS regions to form second concentration impurity regions 155 and 157, respectively (as a source/drain region).

As a result, as shown in FIG. 9, planar channel transistors using a multilayer structure according one embodiment are formed. In particular, according to some embodiments, a semiconductor device comprises a semiconductor substrate having a first well region of a first conductivity-type and a second well region of a second-conductivity type; an insulated gate electrode pattern over the first well region, a source region and a drain region of a second-conductivity type formed adjacent opposite sides of the gate electrode pattern. The insulated gate electrode pattern comprises a gate insulating layer over the semiconductor substrate; a doped conductive layer over the gate insulating layer; a diffusion barrier layer over the doped conductive layer, the diffusion barrier layer comprising an amorphous semiconductor material; an ohmic contact layer over the diffusion barrier layer; a metal barrier layer over the ohmic contact layer; and a metal layer over the metal barrier layer. The first-conductivity type is n-type and the second-conductivity type is p-type.

According to some embodiments, the semiconductor device further comprises a second insulated gate electrode pattern over the second well region, a second source region and a second drain region of the first-conductivity type formed adjacent opposite sides of the second insulated gate electrode pattern, wherein the second insulated gate electrode pattern comprises: a second gate insulating layer over the semiconductor substrate; a second doped conductive layer over the second gate insulating layer; a second diffusion barrier layer over the second doped conductive layer, the second diffusion barrier layer comprising an amorphous semiconductor material; a second ohmic contact layer over the second diffusion barrier layer; a second metal barrier layer over the second ohmic contact layer; and a second metal layer over the second metal barrier layer. The first-conductivity type is n-type and the second-conductivity type is p-type.

Figure 10:
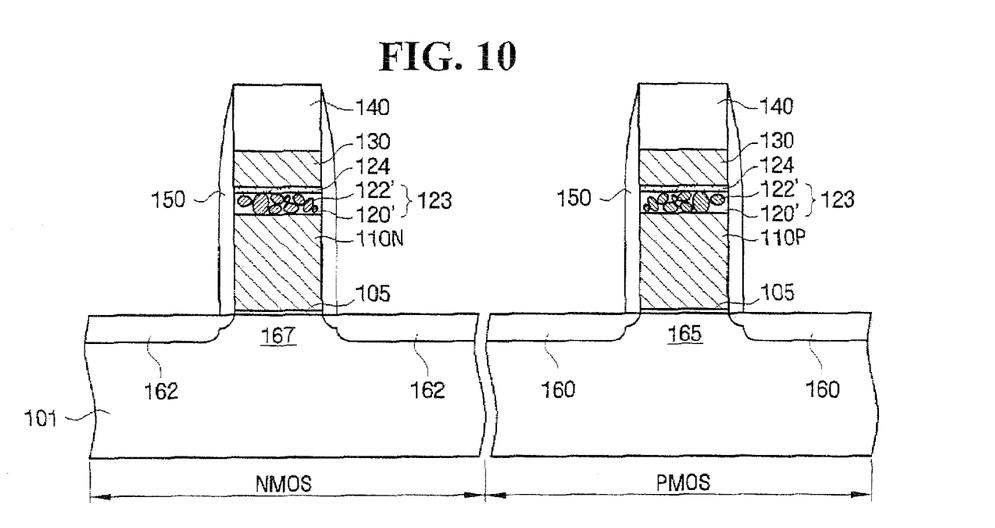
FIG. 10 is a sectional view showing a planar channel transistor using a multilayer structure according to another embodiment.

Referring to FIG. 10, optionally, the resulting structure may be heated at least until a plurality of conductive particles 122' functioning as an ohmic contact layer are formed in the diffusion barrier layer 120', thereby forming a composite diffusion barrier 123. Preferably, the heating is performed at a temperature range of about 600 to about 800° C., more preferably, between about 730 to about 760° C. The heating may be done incidentally during various processing steps involving heat treatment such as rapid thermal processing (RTP) activation or silicon nitride deposition.

Figure 11:
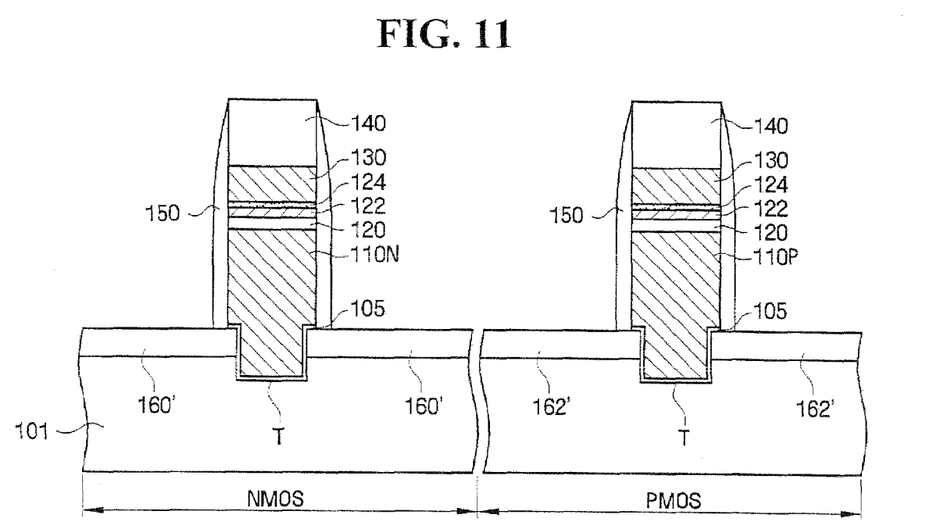
FIG. 11 is a sectional view showing a recess channel transistor using a multilayer structure according to another embodiment.

Referring to FIG. 11, a recess channel trench T may be formed in the semiconductor substrate 101 under the gate electrode pattern and a gate insulating layer 105 is formed along an inner surface of the recess channel trench T in accordance with another embodiment of the present invention. N+ junction regions 160' are formed along opposite sides of the gate electrode pattern over the NMOS region. And P+ junction regions 162' are formed along opposite sides of another gate electrode pattern over the PMOS region. With this embodiment, the semiconductor device can secure a sufficiently increased channel length to overcome the potential problems of short channel effect and punchthrough between the junction regions. The recess channel trench T may be formed using known techniques such one disclosed in U.S. patent application Ser. No. 10/969,751 filed on Oct. 19, 2004, the entire content of which are incorporated herein by reference.

Figure 12:
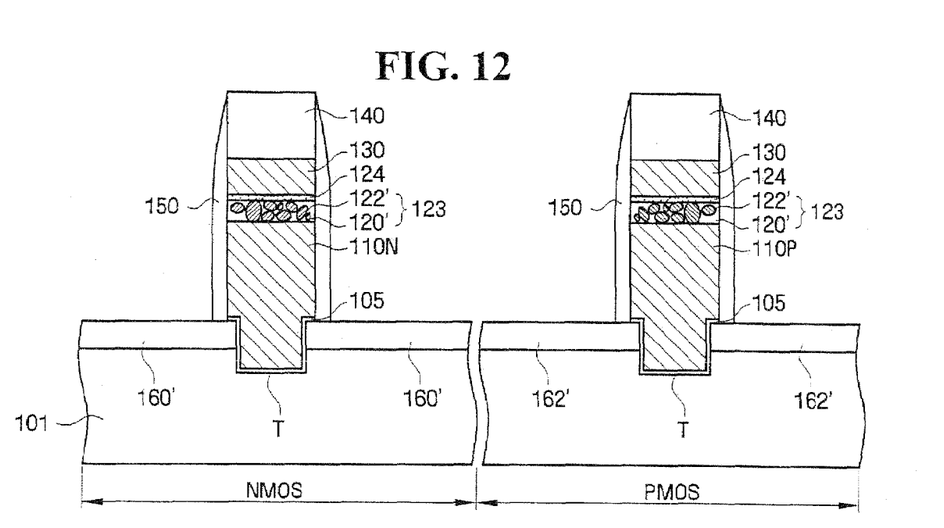
FIG. 12 is a sectional view showing a recess channel transistor using a multilayer structure according to another embodiment.

Referring to FIG. 12, according to yet another embodiment of the present invention, a semiconductor device having a composite diffusion barrier layer 123 formed in a manner same or similar to the diffusion barrier layer 123 of, for example, FIG. 10. Also, the semiconductor shown in this embodiment additionally includes a trench T and a gate insulating layer 105 formed in the same or similar manner to the embodiment shown in FIG. 11.

Figure 13:
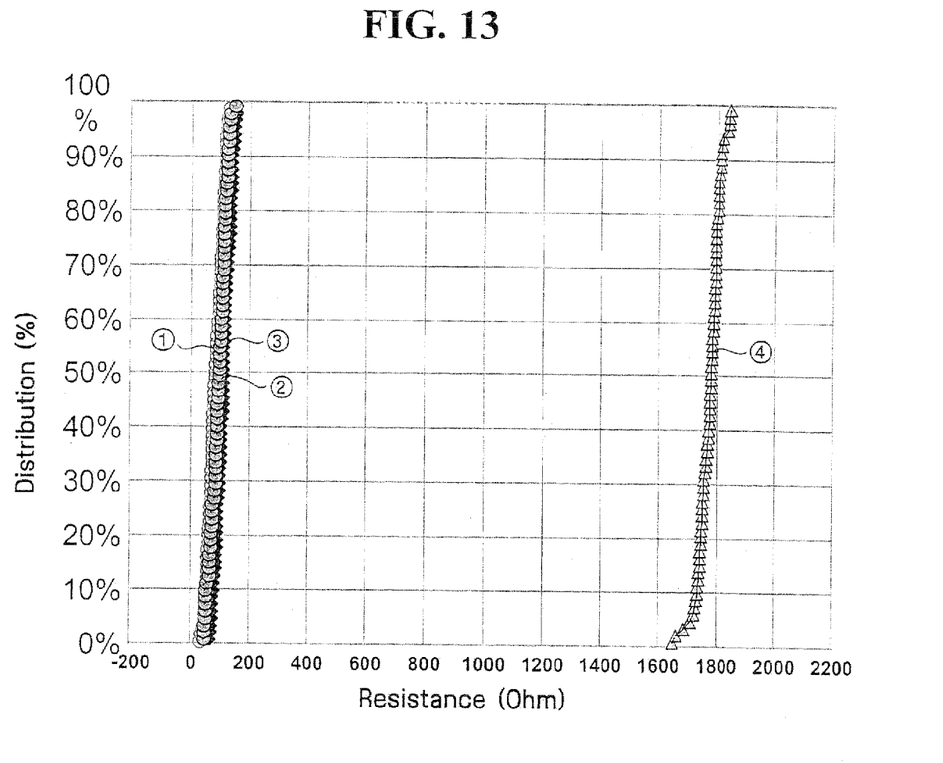
FIG. 13 is a graph illustrating the distribution of interface resistances for the experiment samples having a diffusion barrier layer according to some embodiments of the present invention and also and those of the sample formed without the diffusion barrier layer to illustrate the beneficial effects of the present invention.

Referring to FIG. 13, the vertical ramps visible in the graph of FIG. 13 represent two continua of sample data points, the first on the left representing three samples utilizing the invention and exhibiting acceptable resistances less than 700 ohms and the second on the right representing one sample exhibiting unacceptable resistances substantially over about 700 ohms. In detail, experiments are performed using a gate structure including a polysilicon layer doped with p-type impurities, the diffusion barrier layer comprising an initially undoped (but may be doped later depending on the subsequent manufacturing steps involving the heat treatment) amorphous silicon layer, an ohmic contact layer comprising a metal silicide, a metal barrier layer comprising a tungsten nitride, a metal layer comprising tungsten (e.g., Poly/WSix/ WN/W stack) to show the effects of the diffusion barrier layer 20 of FIG. 1 or the composite diffusion barrier 23 of FIG. 3 in terms of the interface resistance, Further, ①, ②, and ③ of FIG. 13 refer to specimens in which amorphous silicon diffusion barrier layers are formed having thicknesses of about 30, 50 and 70 angstroms in the PMOS transistor, respectively. With respect to ④ of FIG. 13, the specimen is prepared without forming a diffusion barrier layer and an ohmic contact layer, e.g., a Poly/WN/W stack structure. As illustrated in FIG. 13, considering the maximum acceptable resistance value is about 700 ohm, the case of ④ where the diffusion barrier layer and the ohmic contact layer are not included in the specimen, the interface resistance is unacceptable, i.e., substantially higher than the maximum acceptable resistance value of about 700 Ohm. In contrast, in the cases of, ①, ②, and ③ all of which contain a tungsten silicide layer as an ohmic contact layer and an initially undoped (but may be doped subsequently) amorphous silicon diffusion barrier, the interface resistance is substantially lower than the maximum value required for the device. Therefore, with the addition of the diffusion barrier layer, the interface resistance can be improved (lowered). Also, it has been determined that the thickness of the diffusion barrier layer 20 has no significant impact on the contact resistance between the metal layer and the ohmic contact layer. In other words, even if the thickness of the diffusion barrier layer 20 is increased to reduce the diffusion paths, i.e., increasing the inversion capacitance value, the contact resistance can still be maintained.

Figure 14:
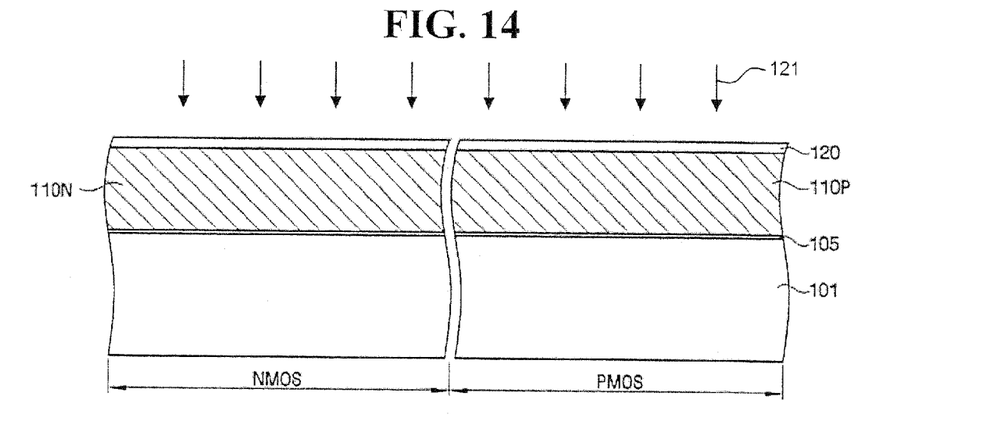
FIG. 14 is a cross-sectional view of the multi-layer structure of a semiconductor device according to the one embodiment including a planar channel transistor in a method for manufacturing the same according to another embodiment of the present invention.

FIG. 14 is a cross-sectional view of the multilayer structure for forming planar transistors according to some embodiments of the present invention.

Referring to FIG. 14, after forming the diffusion barrier layer 120, a heat treatment process indicated by arrows 121 may be additionally performed before forming the ohmic contact layer 122 shown in FIG. 6. The heat treatment process 121 may be performed to improve the function of the diffusion barrier layer 120, increasing the inversion capacitance of a PMOS transistor by more effectively preventing dopants from being out-diffused from a doped lower conductive layer 110P.

The heat treatment process 121 may be performed by a heat treatment process such as a furnace heat treatment process or rapid thermal process (RTP). One skilled in the art will understand that other suitable heat treatment processes can be used within the spirit and the scope of the present invention.

The furnace heat treatment process may be performed at a temperature range of about 200° C. to about 800° C. for about 10 minutes to about 2 hours. The RTP may be performed at a temperature range of about 500° C. to about 1000° C. for about 10 seconds to about 5 minutes. However, the ranges of the treatment temperature and time are provided for illustrative purposes only and the exemplary ranges are not intended to be limiting in any way.

FIGS. 15A through 15D are graphs illustrating the analysis of inversion capacitance values of PMOS transistors manufactured under processing conditions proposed in Table 1.

TABLE 1

|  | Sample a | Sample b | Sample c | Sample d |
|---|---|---|---|---|
| Doped lower conductive layer (Polysilicon layer) | Counter-doping with "B" | | | |
| Diffusion barrier layer (Amorphous silicon layer) | | | Deposited to a thickness of 100 Å | |
| Heat treatment | | RTP at 850° C. for 30 sec. | | RTP at 850° C. for 30 sec. |
| Ohmic contact layer (Metal silicide layer) | Deposition of 80 Å thick WSi$_x$ | | | |

Figure 15A:
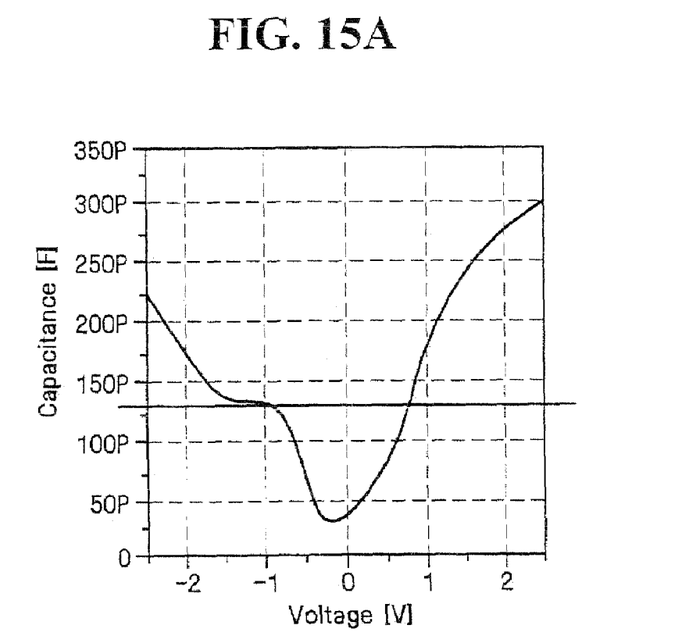
FIGS. 15A through 15D are graphs illustrating the analysis of inversion capacitance inversion capacitance values of PMOS transistors manufactured under processing conditions proposed in Table 1.

FIG. 15A represents a C-V curve of PMOS transistors without a diffusion barrier layer and without a heat treatment before forming an ohmic contact layer (Sample "a"). In contrast, FIG. 15C represents another C-V curve of PMOS transistors having a diffusion barrier layer (an amorphous silicon layer) and also without a heat treatment before forming an ohmic contact layer. As shown, the PMOS transistors of Sample "c" exhibit an increase of about 50 pF in the inversion capacitance (F) compared to the PMOS transistors of Sample "a."

Figure 15B:
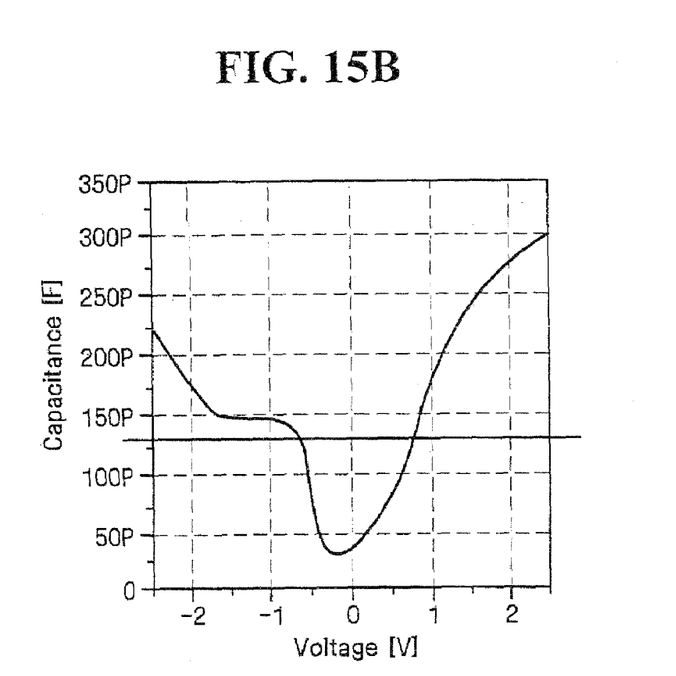
Figure 15C:
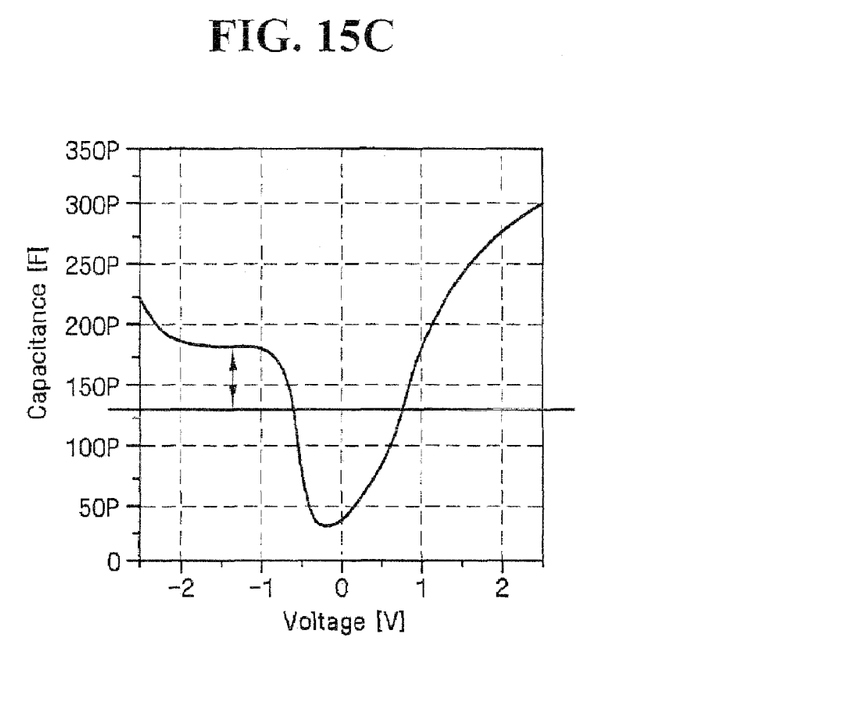
Figure 15D:
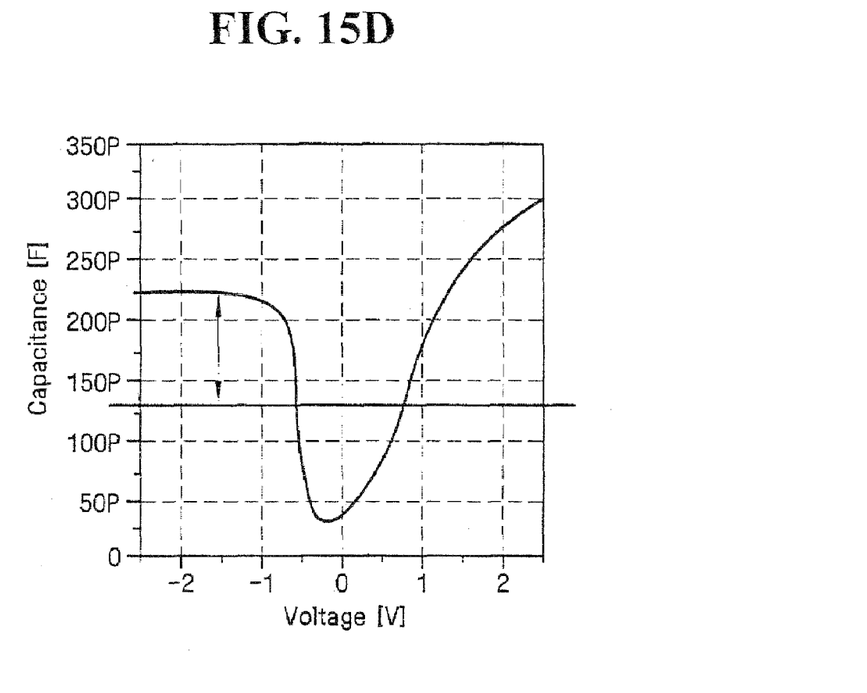

On the other hand, FIG. 15B represents a C-V curve of PMOS transistors without a diffusion barrier layer, but with a heat treatment before forming an ohmic contact layer. In contrast, FIG. 15D represents a C-V curve of PMOS transistors having a diffusion barrier layer (an amorphous silicon layer) and also having a heat treatment performed at about 850° C. for about 30 seconds before forming an ohmic contact layer. In this case, the PMOS transistors of Sample "d" exhibit an increase of about 100 pF in the inversion capacitance (F) as compared to the PMOS transistors of Sample "b." According to the experimental results, the processing steps subsequent to the formation of the amorphous silicon layer that involve a heat treatment can effectively improve the function of the diffusion barrier layer.

Therefore, with some embodiments of the present invention, higher speed and lower power devices can be realized due to the beneficial increase in overall inversion capacitance that results from the unique diffusion barrier layer/ohmic contact layer structure disclosed and illustrated herein in various embodiments, This unique diffusion barrier layer/ohmic contact layer structure can reduce poly depletion problem of the prior art. Further, according to some embodiments, the present invention can be used to fabricate volatile memories such as dynamic random access memories (DRAMs) or to fabricate non-volatile memories such as flash memories.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Having described and illustrated the principles of the invention in several preferred embodiments, it should be apparent that the embodiments may be modified in arrangement and detail without departing from such principles. We claim all modifications and variation coming within the spirit and scope of the following claims.

What is claimed is:

1. A method of fabricating a semiconductor device, the method comprising:
   forming a gate insulating layer;
   forming a doped conductive layer on the gate insulating layer;
   forming a diffusion barrier layer on the doped conductive layer, the diffusion barrier layer comprising an undoped semiconductor material;
   thereafter, heat treating the diffusion barrier layer;
   forming an ohmic contact layer on the heat-treated diffusion barrier layer;
   forming a metal barrier layer on the ohmic contact layer; and
   forming a metal layer on the metal barrier layer.

2. The method of claim 1, wherein the diffusion barrier layer comprises an amorphous material.

3. The method of claim 1, wherein heat treating the diffusion barrier layer comprises a furnace heat treatment process or rapid thermal process (RTP).

4. The method of claim 3, wherein the furnace heat treatment process is performed at a temperature range of about 200 to about 800° C.

5. The method of claim 4, wherein the furnace heat treatment process is performed for about 10 minutes to about 2 hours.

6. The method of claim 3, wherein the RTP is performed at a temperature range of about 500 to about 1000° C.

7. The method of claim 6, wherein the RTP is performed for about 10 seconds to about 5 minutes.

8. The method of claim 1, which further comprises:
   sequentially patterning the metal layer, the metal barrier layer, the ohmic contact layer, the diffusion barrier layer, the doped conductive layer and the gate insulating layer to form a gate structure.

9. The method of claim 1, which further comprises:
   heating the resulting structure at least until a plurality of conductive particles are formed in the diffusion barrier layer, thereby forming a composite diffusion barrier layer.

10. The method of claim 9, wherein the heating is performed at a temperature range of about 700° C. to about 800° C.

11. The method of claim 9, wherein the resulting structure includes the diffusion barrier layer and the ohmic contact layer.

12. The method of claim 11, wherein the plurality of conductive particles comprises a material of the ohmic contact layer.

13. The method of claim 1, wherein the semiconductor material is silicon.

* * * * *

UNITED STATES PATENT AND TRADEMARK OFFICE
CERTIFICATE OF CORRECTION

PATENT NO. : 7,439,176 B2  
APPLICATION NO. : 11/379350  
DATED : October 21, 2008  
INVENTOR(S) : Jae-Hwa Park et al.

It is certified that error appears in the above-identified patent and that said Letters Patent is hereby corrected as shown below:

On the title page, item [56]:
In References Cited, US Patent Documents, Reference number "5,695,942" should read -- 5,965,942 --;
Column 4, line 37, the word "("1.20-010")" should read -- ("1.20E-010") --.

Signed and Sealed this

Ninth Day of December, 2008

JON W. DUDAS  
*Director of the United States Patent and Trademark Office*